(12) United States Patent
Kim et al.

(10) Patent No.: US 6,558,999 B2
(45) Date of Patent: May 6, 2003

(54) METHOD FOR FORMING A STORAGE ELECTRODE ON A SEMICONDUCTOR DEVICE

(75) Inventors: Jeong Ho Kim, Kyoungki-do (KR); Yu Chang Kim, Kyoungki-do (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 09/860,779

(22) Filed: May 21, 2001

(65) Prior Publication Data
US 2002/0006697 A1 Jan. 17, 2002

(30) Foreign Application Priority Data
May 24, 2000 (KR) ........................................ 2000-28008

(51) Int. Cl.⁷ .................. H01L 21/8234; H01L 21/8244
(52) U.S. Cl. ........................................ 438/239; 438/381
(58) Field of Search ................................ 438/210, 239, 438/240, 253, 257, 396, 381, 643, 637, 672, 675, 689

(56) References Cited

U.S. PATENT DOCUMENTS

| | | | | | |
|---|---|---|---|---|---|
| 5,543,345 | A | * | 8/1996 | Liaw et al. .................. | 438/397 |
| 5,607,874 | A | * | 3/1997 | Wang et al. .................. | 438/397 |
| 5,733,808 | A | * | 3/1998 | Tseng .......................... | 438/239 |

* cited by examiner

Primary Examiner—David Nelms
Assistant Examiner—David Nhu
(74) Attorney, Agent, or Firm—Pillsbury Winthrop LLP

(57) ABSTRACT

The present invention provides a method for forming a storage electrode on a semiconductor substrate, and in particular to a storage electrode formation method which can prevent formation of a sharp upper edged cylindrical storage electrode, thereby improving a dielectric property and reliability of a capacitor.

19 Claims, 4 Drawing Sheets

METHOD FOR FORMING A STORAGE ELECTRODE ON A SEMICONDUCTOR DEVICE

FIELD OF THE INVENTION

The present invention relates to a method for forming a storage electrode on a semiconductor substrate, and in particular to a storage electrode formation method which can prevent formation of a sharp upper edged cylindrical storage electrode.

BACKGROUND OF THE INVENTION

Typically, a capacitor having a high capacitance is required to produce a high integration memory device. Different approaches for producing a high capacitance capacitor have been developed. In one particular method, an effective area of a storage electrode is widened to provide a high capacitance capacitor. Widening the storage electrode area requires a relatively large surface area semiconductor; therefore, this method is generally not suitable for producing a high integration semiconductor substrate of limited surface area.

In another method, an increase in capacitor's capacitance is achieved using a dielectric material having a high dielectric constant. In this method, a storage electrode is typically oxidized during the dielectric material crystallization process. This results in a formation of a diffusion barrier film on the dielectric material. The storage electrode is generally produced using a noble metal. Therefore, a leakage current is often generated at the interface between the diffusion barrier film and the dielectric film. Even when a high dielectric material, such as $(Ba_{1-x}Sr_x)TiO_3$ (BST) or $SrTiO_3$ (STO), is used to increase the capacitor's capacitance, the storage electrode is generally produced using a noble metal. Most often, noble metal platinum is used because it generally does not react significantly with a reaction gas during an etching process. Of the small amount of platinum that react with the reaction gas, most of the reacted platinum is often re-deposited at side walls in the etching process. Therefore, use of platinum in conventional storage electrode production has a technical limit in the patterning and etching processes. Moreover, the separation distance between storage electrodes of about 0.15 μm or smaller is difficult to achieve. Furthermore, vertical storage electrode profiles are also difficult to achieve.

Such an etching property hardly satisfies the design specification when the effective area of storage electrode is increased by increasing its height. Formation of a geometric shape storage electrode by stacking layers of storage electrodes in a narrow area typically requires repeated depositing, masking and etching of the storage electrode material. The whole process is relatively complicated, and often there is a significant height difference between each semiconductor substrates after the capacitor formation. In addition, the height difference within each semiconductor substrate between the region where the capacitor has been formed and the region where the capacitor has not been formed is substantially identical to the height of the capacitor, which causes problems in a subsequent metal interconnection process.

A conventional method for forming a storage electrode of a semiconductor device will now be explained in detail with reference to the accompanying FIGS. 1A and 1B, which are cross-sectional diagrams illustrating sequential steps for forming a storage electrode on a semiconductor substrate.

As illustrated in FIG. 1A, a substructure including a device isolation insulation film, a metal-oxide semiconductor field effect transistor (MOSFET), and a bit line are formed on a semiconductor substrate 11. An interlayer insulation film 13 is formed over the resultant structure. Thereafter, the interlayer insulation film 13 is etched using a storage electrode contact mask to expose a presumed storage electrode contact region on the semiconductor substrate 11, thereby forming a storage electrode contact hole (not shown). A storage electrode contact plug 15 contacting the semiconductor substrate 11 through the storage electrode contact hole is then produced.

A first conductive layer (not shown) and a core insulation film (not shown) are sequentially coated on to the resultant structure. The core insulation film and the first conductive layer are etched using a storage electrode mask to protect the presumed storage electrode region. This results in formation of a stacked structure of a core insulation film pattern 19 and a first conductive layer pattern 17. A second conductive layer 21 is formed over the resultant structure to contact the first conductive layer pattern 17. As shown in FIG. 1B, a second conductive layer spacer 23 is formed at the side walls of the stacked structure by etching the second conductive layer 21. Thereafter, a cylindrical storage electrode comprising the first conductive layer pattern 17 and the second conductive layer spacer 23 is produced by removing the core insulation film pattern 19.

One of the disadvantages in most conventional storage electrode formation methods is that the upper portion of the cylindrical second conductive layer spacer 23 has a sharp upper edge (i.e., pointed). See element (a) in FIG. 1B. This results in deterioration of the dielectric property of dielectric material. In addition, formation of the conductive layer spacer typically produces incomplete etching of the conductive layer which results in a short between the storage electrodes, thereby reducing the overall yield of the semiconductor substrate.

SUMMARY OF THE INVENTION

Therefore, it is an object of the present invention to provide a method for forming a storage electrode on a semiconductor substrate which can prevent the upper portion of the cylindrical storage electrode from being pointed and also prevent a short from being generated between the storage electrodes. Accordingly, one aspect of the present invention provides a method for forming a conductive layer as high as the storage electrode, and forming the storage electrode by a two-step etching process with a high etching selection ratio for the conductive layer using an insulation film pattern as a mask.

One particular embodiment of the present invention provides a method for forming a semiconductor device comprising a storage electrode, said method comprising the steps of:

producing a semiconductor substrate comprising a conductive layer, a pattern producing layer, and an etch barrier film disposed inbetween said conductive layer and said pattern producing layer;

producing a storage electrode region pattern on said pattern producing layer; and producing a storage electrode region from said conductive layer using said storage electrode region pattern of said pattern producing layer.

The semiconductor substrate can further comprise an interlayer insulation film between the semiconductor substrate and the conductive layer. The interlayer insulation film can also include a storage electrode contact plug.

The method can further include the steps of removing the pattern producing layer after the step of producing storage electrode region from the conductive layer.

The step of producing the storage electrode region from the conductive layer can include the steps of producing a spacer type insulation film on the storage electrode region pattern. The spacer type insulation film producing step can further include the steps of: coating the storage electrode region pattern produced from the pattern producing layer with an insulation film; and removing the insulation film and the etch barrier film to produce the spacer type insulation film comprising the insulation film on side walls of the storage electrode region pattern of the pattern producing layer.

And the step of producing the storage electrode region from the conductive layer can further comprise the steps of: removing the pattern producing layer and a predetermined thickness of the conductive layer using the spacer type insulation film as a mask and the etch barrier film as an etch stop layer; and removing the etch barrier film and the conductive layer to form the storage electrode using the spacer type insulation film as a mask.

In one particular embodiment of the present invention, the pattern producing layer is a second conductive layer.

Another aspect of the present invention provides a method for producing a storage electrode on a semiconductor substrate comprising the steps of:

producing a semiconductor substrate comprising an interlayer insulation film, wherein said interlayer insulation film comprises a storage electrode contact plug;

forming a conductive layer on said interlayer insulation film;

forming an etch barrier film on said conductive layer;

forming a second conductive layer on said etch barrier film for protecting a presumed storage electrode region on said etch barrier film;

forming a storage electrode region pattern on said second conductive layer;

forming an insulation film on said storage electrode region pattern;

etching said insulation film and said etch barrier film to produce a spacer type insulation film pattern at the side walls of said second conductive layer storage electrode region pattern, and to produce a first etch barrier film pattern at the lower portions of said insulation film and said second conductive layer storage electrode region pattern;

removing said second conductive layer and a predetermined thickness of said conductive layer using said insulation film as an etching mask and using said first etch barrier film pattern as an etch stop layer;

forming a cylindrical storage electrode and a second etch barrier film pattern at the lower portion of said insulation film by etching the residual conductive layer and said first etch barrier film pattern using said insulation film as an etching mask; and removing said insulation film and said second etch barrier film pattern to produce said storage electrode on said semiconductor substrate.

DETAILED DESCRIPTION OF THE PREFERRED EMBODIMENTS

The present invention will be described with regard to the accompanying drawings, in particular FIGS. 2A to 2F, which assist in illustrating various features of the invention. It should be appreciated that the drawings are provided for the purpose of illustrating the practice of the present invention and do not constitute limitations on the scope thereof.

Figure 1A:
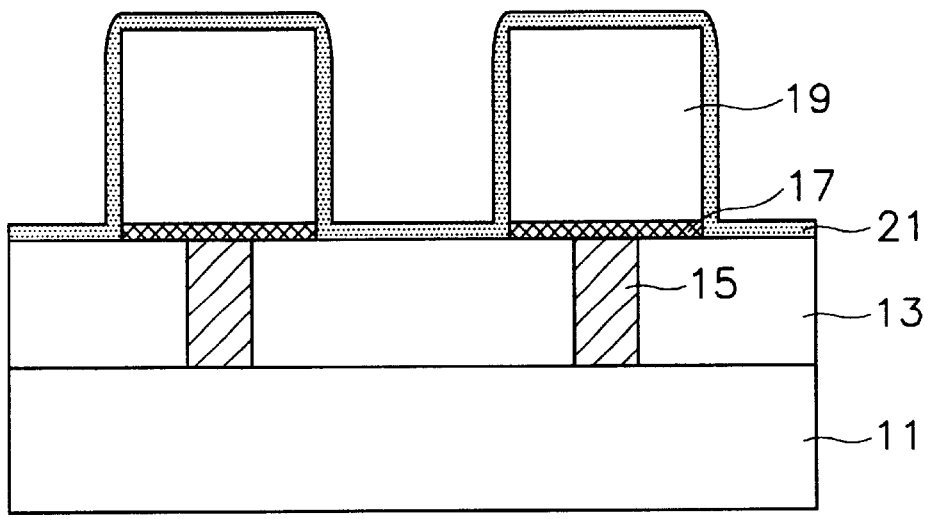
FIGS. 1A and 1B are cross-sectional diagrams illustrating sequential steps of a conventional method for forming a storage electrode of a semiconductor device.
Figure 1B:
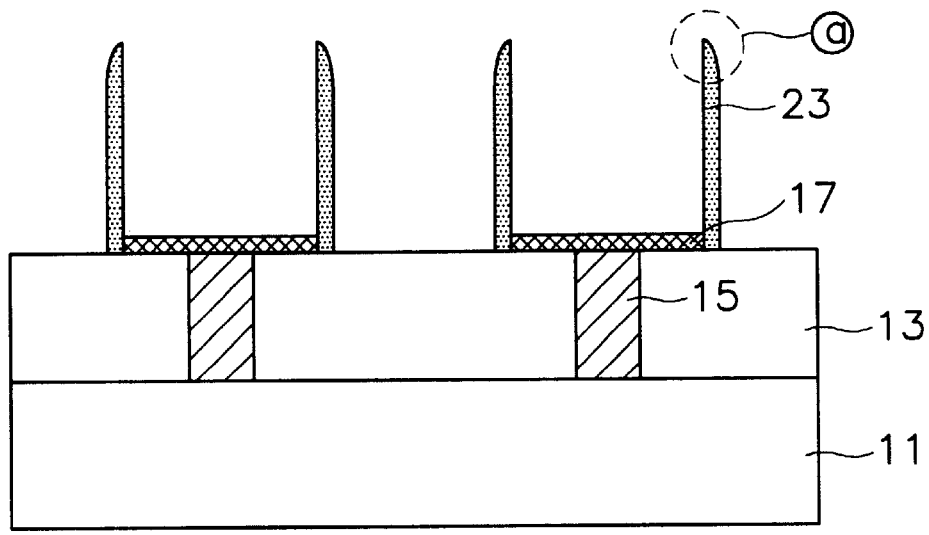
Figure 2A:
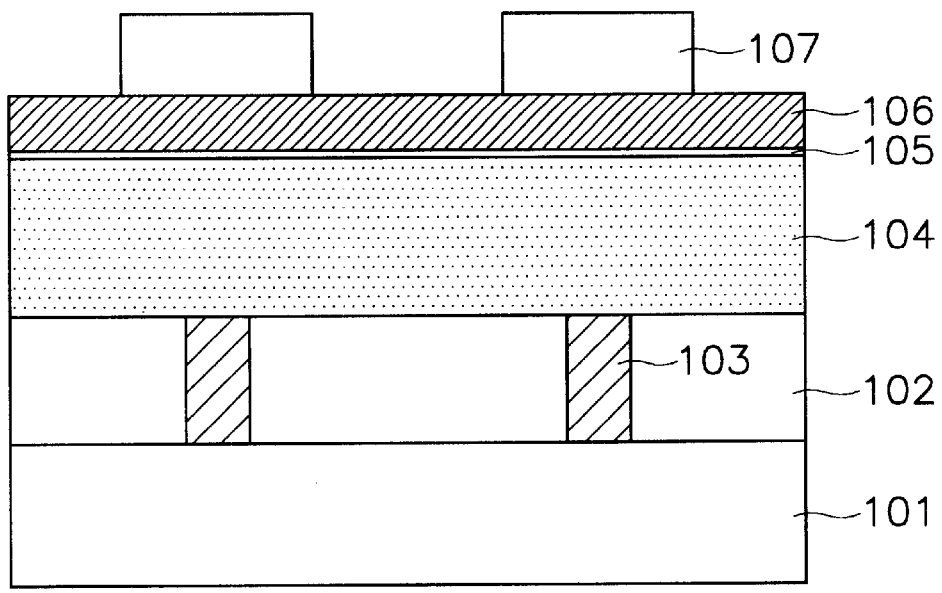
FIGS. 2A through 2F are cross-sectional diagrams illustrating a method for producing a storage electrode on a semiconductor substrate in accordance with the present invention.

As illustrated in FIG. 2A, a device isolation oxide film (not shown) for defining an active region (not shown) is formed on a semiconductor substrate 101. A gate oxide film (not shown) is formed over the resultant structure, and a substructure, such as a MOSFET comprising a gate electrode (not shown) and source/drain electrodes (not shown) and a bit line (not shown), is formed thereon. An interlayer insulation film 102 is formed over the resultant structure. The interlayer insulation film 102 is etched using a storage electrode contact mask as an etching mask to expose a presumed storage electrode contact region on the semiconductor substrate 101, thereby producing a storage electrode contact hole (not shown).

A conductive layer (not shown), which also fills the storage electrode contact hole, is formed over the resultant structure. The conductive layer is removed using a whole etching process or a chemical mechanical polishing (CMP) process to produce a storage electrode contact plug 103.

A conductive layer 104, which ultimately becomes the storage electrode, an etch barrier film 105, and a sacrificed (i.e., second) conductive layer 106 are sequentially formed over the resultant structure. A photoresist film pattern 107 for protecting a presumed storage electrode region is formed on the sacrificed conductive layer 106. Preferably, the height of conductive layer 104 is substantially equal to the height of the eventual storage electrode.

In one embodiment of the present invention, the etch barrier film 105 consists of an oxide film, a nitride film, or an oxide nitride film. Preferably, the oxide film comprises $Al_2O_3$ or $Ta_2O_5$.

In one particular embodiment of the present invention, the conductive layer 104 and the sacrificed conductive layer 106 comprises polysilicon.

Figure 2B:
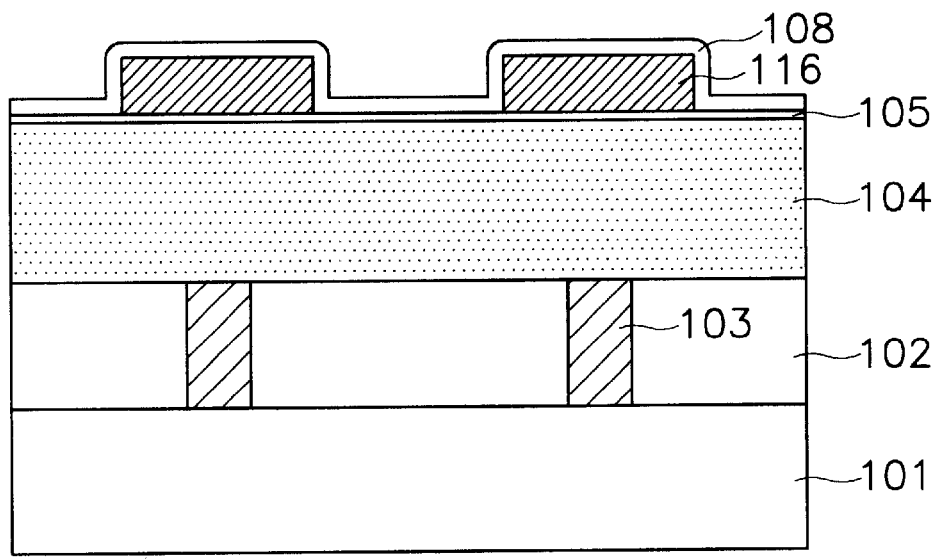

Referring to FIG. 2B, the sacrificed conductive layer 106 is etched using the photoresist film pattern 107 as an etching mask to produce a sacrificed conductive layer pattern 116. This process for etching the sacrificed conductive layer 106 is performed by using the etch barrier film 105 as an etch barrier. The photoresist film pattern 107 is removed. And a predetermined thickness of insulation film 108 is coated over the resultant structure. Preferably, the insulation film 108 consists of an oxide film.

Figure 2C:
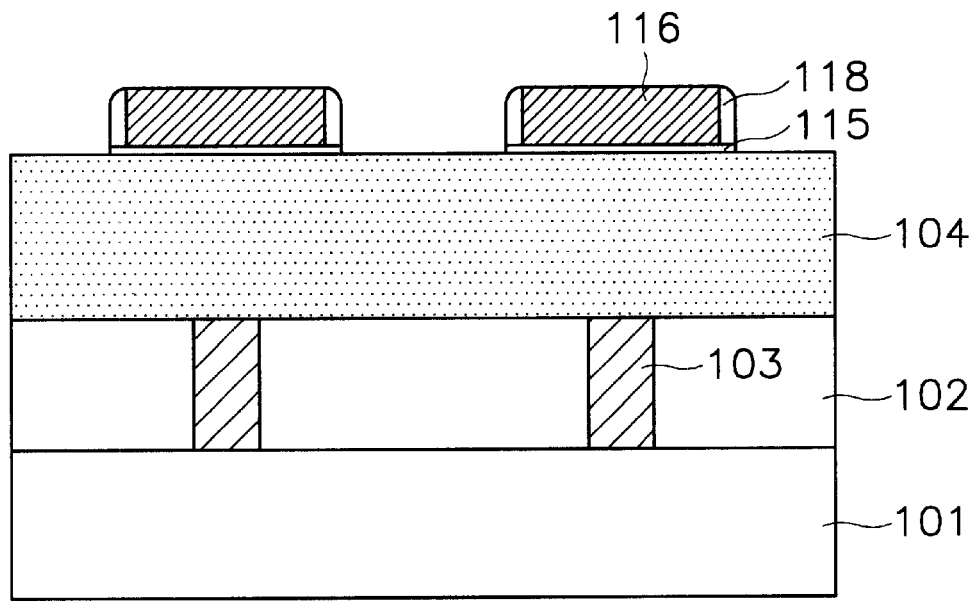

As depicted in FIG. 2C, a spacer type insulation film pattern 118 is produced at the side walls of the sacrificed conductive layer pattern 116. In addition, a first etch barrier film pattern 115 is produced at the lower portions of the sacrificed conductive layer pattern 116 and the insulation film 118 by etching the insulation film 108 and the etch barrier film 105. If the etch barrier film 105 which consists of $Al_2O_3$ film or $Ta_2O_5$ film, it is etched using a fluorine derivative gas as a main etching gas. The fluorine derivative gas is selected from the group consisting of $CF_4$, $C_2F_4$, $C_3F_8$, $C_4F_6$, $C_4F_8$, $C_5F_8$, $CHF_3$, $CH_2F_2$, $CH_3F$, $NF_3$ and $SF_6$. The etching process can also be performed using a mixed gas of a halogen or a halogen derivative gas, oxygen ($O_2$) or an oxygen derivative gas, and an inert gas as a sub-etching gas. Preferably, the halogen gas is $Cl_2$. Preferably, the halogen derivative gas is selected from the group consisting of $BCl_3$ and HBr. Preferably, the oxygen derivative gas is selected from the group consisting of CO, $CO_2$, NO and $NO_2$. Preferably, the inert gas is selected from the group consisting of He, Ne, Ar and Xe.

Figure 2D:
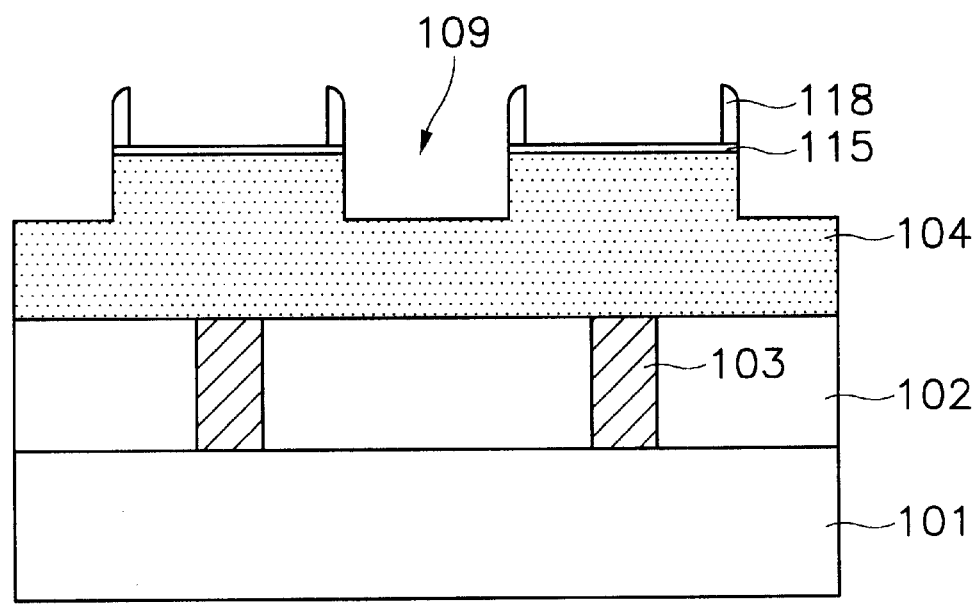

As shown in FIG. 2D, the sacrificed conductive layer pattern 116 and a predetermined thickness of conductive layer 104 are etched using the insulation film 118 as an etching mask. During this etching process, prefeably from about 50 to about 70% of the conductive layer 104 is removed. Moreover, this etching process is conducted using the first etch barrier film pattern 115 formed at the lower portion of the sacrificed conductive layer pattern 116 as an etch stop layer. Substantially all of the sacrificed conductive layer pattern 116 is removed during this etching process; however, a trench 109 is formed on the conductive layer 104 exposed to the first etch barrier film pattern 115.

Figure 2E:
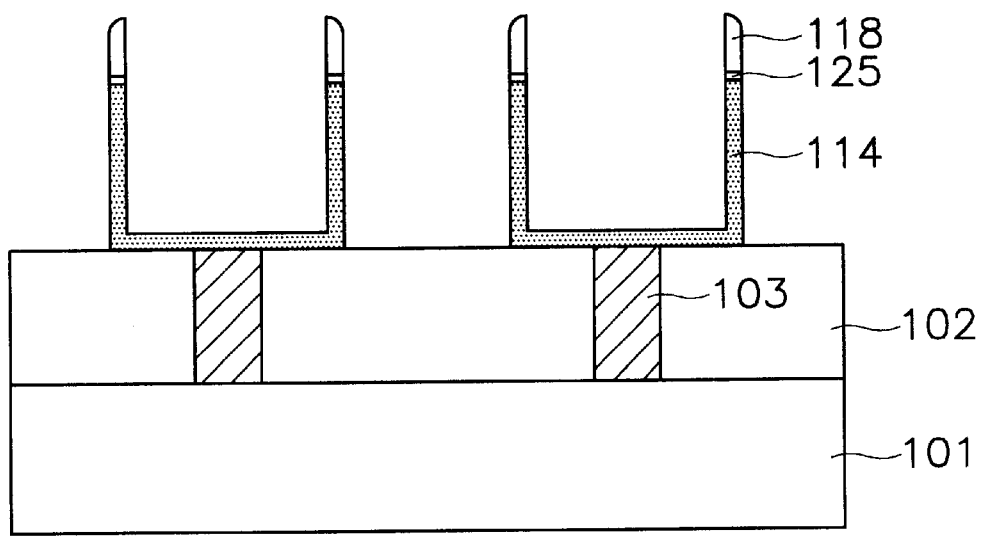
Figure 2F:
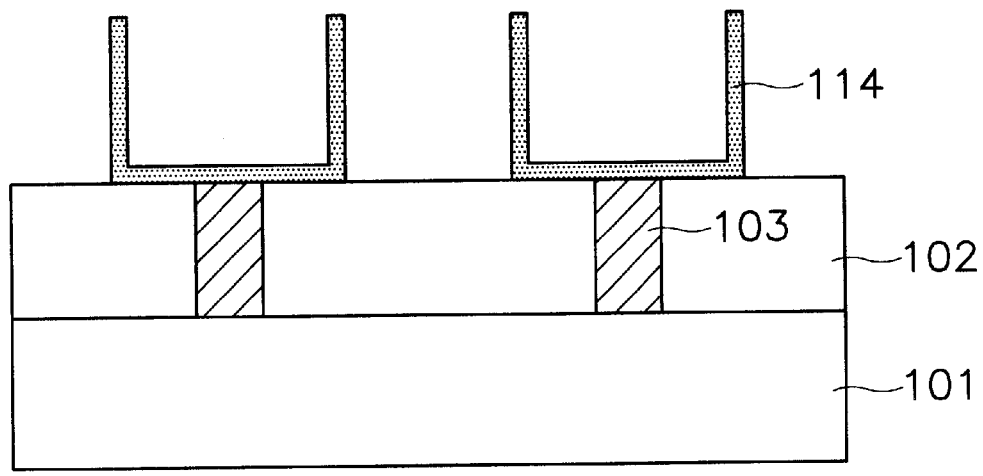

As illustrated in FIG. 2E, the first etch barrier film pattern 115 and the residual conductive layer 104 are etched using the insulation film pattern 118 as an etching mask to produce a second etch barrier film pattern 125 at the lower portion of the insulation film pattern 118. This etching process also produces the cylindrical storage electrode 114. Preferably, the thickness of the cylindrical storage electrode 114, which is in contact with the storage electrode contact plug 103, ranges from about 800 Å to 1200 Å. As depicted in FIG. 2F, the insulation film pattern 118 and the second etch barrier film pattern 125 are removed using a wet etching process. Preferably, the wet etching process comprises using an aqueous etching solution comprising HF, $NH_4F$, or mixtures thereof.

Methods of the present invention prevent the side walls of the cylindrical storage electrode from being pointed (i.e., having a sharp upper edge), thereby improving the dielectric property and reliability of a capacitor.

Those skilled in the art will appreciate that numerous changes and modifications can be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method for forming a semiconductor device comprising a storage electrode, said method comprising the steps of:
   producing a semiconductor substrate comprising a conductive layer, a pattern producing layer, and an etch barrier film disposed inbetween said conductive layer and said pattern producing layer;
   producing a storage electrode region pattern on said pattern producing layer; and
   producing a storage electrode region from said conductive layer using said storage electrode region pattern of said pattern producing layer.

2. The method of claim 1, wherein said semiconductor substrate further comprises an interlayer insulation film between said semiconductor substrate and said conductive layer, wherein said interlayer insulation film comprises a storage electrode contact plug.

3. The method of claim 1, further comprising the steps of removing said pattern producing layer after said step of producing storage electrode region from said conductive layer.

4. The method of claim 1, wherein said step of producing said storage electrode region from said conductive layer further comprises the steps of producing a spacer type insulation film on said storage electrode region pattern.

5. The method of claim 4, wherein said method of producing spacer type insulation film comprises the steps of:
   coating said storage electrode region pattern produced from said pattern producing layer with an insulation film; and
   removing said insulation film and said etch barrier film to produce said spacer type insulation film comprising said insulation film on side walls of said storage electrode region pattern of said pattern producing layer.

6. The method of claim 5, wherein said step of producing said storage electrode region from said conductive layer further comprises the steps of:
   removing said pattern producing layer and a predetermined thickness of said conductive layer using said spacer type insulation film as a mask and said etch barrier film as an etch stop layer; and
   removing said etch barrier film and said conductive layer to form said storage electrode using said spacer type insulation film as a mask.

7. The method of claim 1, wherein said pattern producing layer is a second conductive layer.

8. The method of claim 1, wherein said conductive layer and said pattern producing layer comprises a polysilicon.

9. The method of claim 1, wherein said etch barrier film is selected from the group consisting of an oxide film, nitride film, and oxide nitride film.

10. The method of claim 5, wherein said insulation film consists of an oxide film.

11. The method of claim 6, wherein said etch barrier film comprises $Al_2O_3$ or $Ta_2O_5$, and is removed by using a fluorine derivative gas as a main etching gas and a mixed gas of a halogen gas, an oxygen containing gas and an inert gas as a sub-etching gas.

12. The method of claim 5, wherein said insulation film and said etch barrier film are removed by a wet etching process using an aqueous etching solution comprising HF, $NH_4F$, or mixtures thereof.

13. A method for producing a storage electrode on a semiconductor substrate comprising the steps of:
   producing a semiconductor substrate comprising an interlayer insulation film, wherein said interlayer insulation film comprises a storage electrode contact plug;
   forming a conductive layer on said interlayer insulation film;
   forming an etch barrier film on said conductive layer;
   forming a second conductive layer on said etch barrier film for protecting a presumed storage electrode region on said etch barrier film;
   forming a storage electrode region pattern on said second conductive layer;
   forming an insulation film on said storage electrode region pattern;
   etching said insulation film and said etch barrier film to produce a spacer type insulation film pattern at the side walls of said second conductive layer storage electrode region pattern, and to produce a first etch barrier film pattern at the lower portions of said insulation film and said second conductive layer storage electrode region pattern;
   removing said second conductive layer and a predetermined thickness of said conductive layer using said insulation film as an etching mask and using said first etch barrier film pattern as an etch stop layer;

forming a cylindrical storage electrode and a second etch barrier film pattern at the lower portion of said insulation film by etching the residual conductive layer and said first etch barrier film pattern using said insulation film as an etching mask; and removing said insulation film and said second etch barrier film pattern to produce said storage electrode on said semiconductor substrate.

14. The method of claim 13, wherein said conductive layer and said second conductive layer comprises a polysilicon.

15. The method of claim 13, wherein said etch barrier film is selected from the group consisting of an oxide film, nitride film, and oxide nitride film.

16. The method of claim 15, wherein said oxide film comprises $Al_2O_3$ or $Ta_2O_5$.

17. The method of claim 13, wherein said insulation film comprises an oxide film.

18. The method of claim 13, wherein said etch barrier film comprises $Al_2O_3$ or $Ta_2O_5$, and is removed by using a fluorine derivative gas as a main etching gas and a mixed gas of a halogen gas, an oxygen containing gas and an inert gas as a sub-etching gas.

19. The method of claim 13, wherein said insulation film and said etch barrier film are removed by a wet etching process using an aqueous etching solution comprising HF, $NH_4F$, or mixtures thereof.

* * * * *